United States Patent [19]
Park

[11] Patent Number: 6,097,653
[45] Date of Patent: Aug. 1, 2000

[54] CIRCUIT AND METHOD FOR SELECTIVELY OVERDRIVING A SENSE AMPLIFIER

[75] Inventor: San-Ha Park, Seoul, Rep. of Korea

[73] Assignee: LG Semicon Co., Ltd., Choongcheongbuk-do, Rep. of Korea

[21] Appl. No.: 09/164,303

[22] Filed: Oct. 1, 1998

[30] Foreign Application Priority Data

Jan. 21, 1998 [KR] Rep. of Korea .................. 98-1661

[51] Int. Cl.[7] .................................................. G11C 7/02
[52] U.S. Cl. .................. 365/207; 365/189.07; 327/54
[58] Field of Search ......................... 365/189.07, 207, 365/208; 327/54

[56] References Cited

U.S. PATENT DOCUMENTS

| | | | |
|---|---|---|---|
| 4,460,985 | 7/1984 | Hoffman | 365/207 |
| 5,255,231 | 10/1993 | Oh | 365/202 |
| 5,572,475 | 11/1996 | Yim et al. | 365/189.07 |
| 5,909,402 | 6/1999 | Joo | 365/189.07 |

*Primary Examiner*—Richard Elms
*Assistant Examiner*—Vanthu Nguyen

[57] ABSTRACT

An overdriving control circuit includes a comparator for receiving a sense amplifier enable signal and comparing a voltage of bit line or bit bar line with a reference voltage, and a sense amplifier driving unit for logically combining the sense amplifier enable signal and an output signal of the comparator and outputting a control signal of a switch which selectively supplies an internal voltage and an external voltage. The circuit senses a variation of the external voltage or a bouncing of source voltage and controls the overdriving region, thereby obtaining a sufficient overdriving region and accelerating the operation of a sense amplifier.

12 Claims, 3 Drawing Sheets

FIG. 1
BACKGROUND ART
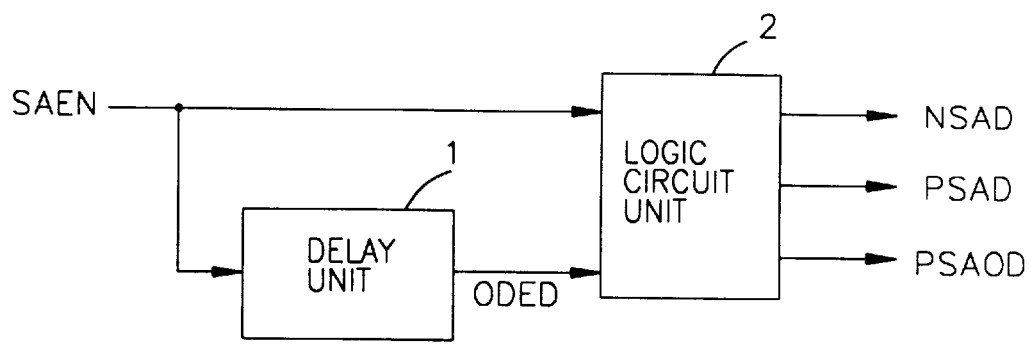
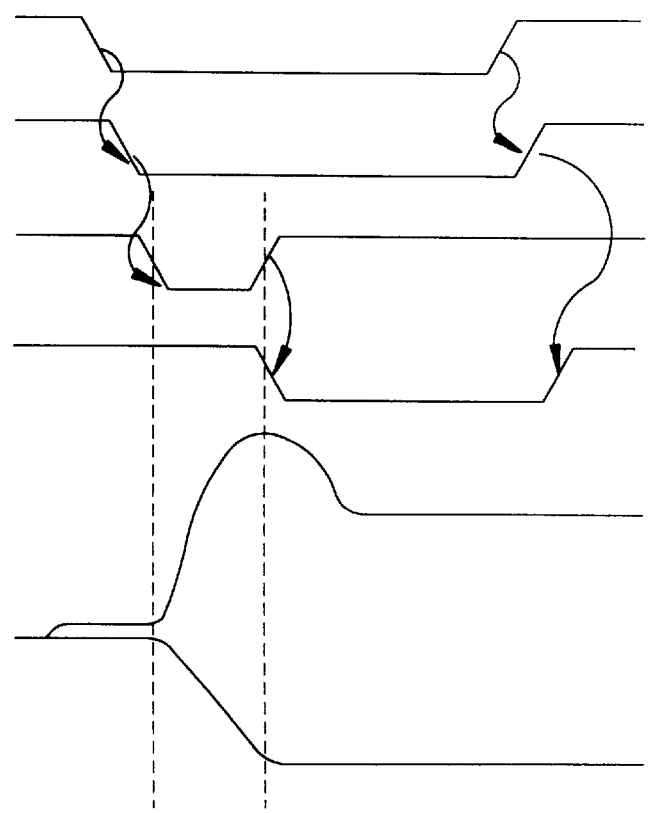
FIG. 2A BACKGROUND ART SAEN
FIG. 2B BACKGROUND ART NSAD
FIG. 2C BACKGROUND ART PSAOD
FIG. 2D BACKGROUND ART PSAD
FIG. 2E BACKGROUND ART BL/$\overline{BL}$ FIG.5
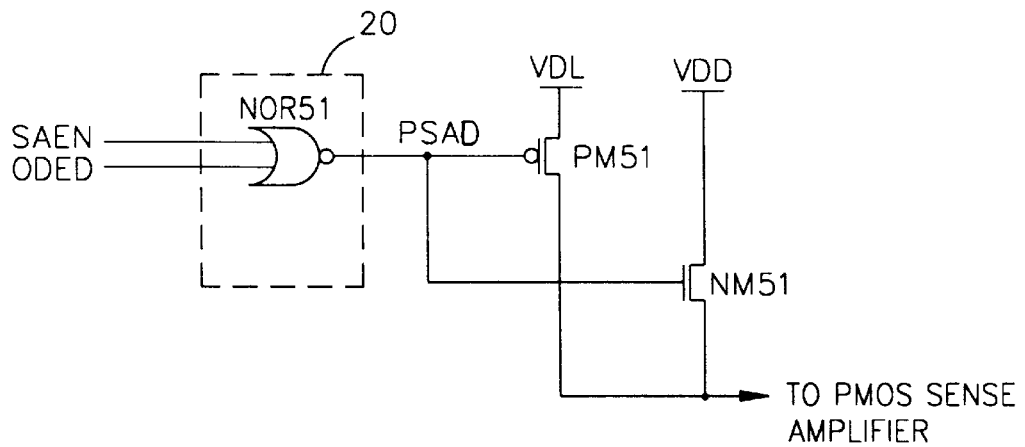
FIG.6A SAEN
FIG.6B ODED
FIG.6C PSAD
FIG.6D BL/$\overline{BL}$

CIRCUIT AND METHOD FOR SELECTIVELY OVERDRIVING A SENSE AMPLIFIER

BACKGROUND OF THE INVENTION

1. Field of the Invention

The present invention relates to an overdriving control circuit for accelerating the operation of a sense amplifier by setting an overdriving zone, and more particularly, to an improved overdriving control circuit capable of setting an optimized overdriving zone by sensing the potential of a bit line.

2. Description of the Background Art

In general, when a sense amplifier is activated according to a over-driven sense amplifier scheme, an external voltage VDD (for example, 3.3V) is initially supplied to improve a data sensing speed of the sense amplifier, and then a low-adjusted internal array voltage VDL (for example, 2.2V) is provided to maintain the accumulated voltage. Here, an overdriving zone denotes a time period during which the low-adjusted internal array voltage VDL is supplied following the provision of external voltage VDD.

As shown in FIG. 1, the conventional overdriving control circuit includes a delay unit 1 for delaying a sense amplifier enable signal SAEN, and a logic circuit unit 2 for logically combining the sense amplifier enable signal SAEN and the delayed sense amplifier enable signal and outputting an NMOS sense amplifier drive signal NSAD, a PMOS sense amplifier drive signal PSAD and a PMOS sense amplifier overdrive signal PSAOD.

The operation of the conventional overdriving control circuit will now be described with reference to the accompanying drawings.

First, the delay unit 1 receives sense amplifier enable signal SAEN as illustrated in FIG. 2A, and outputs an overdriving control signal ODED as a delayed sense amplifier enable signal. The logic circuit unit 2 receives the sense amplifier enable signal SAEN and overdriving control signal ODED to generate PMOS sense amplifier overdrive signal PSAOD having a pulse width equivalent to its delayed time as shown in FIG. 2C.

The PMOS sense amplifier overdrive signal PSAOD and NMOS sense amplifier drive signal NSAD of FIG. 2B are logically combined in the logic circuit unit 2 to produce PMOS sense amplifier drive signal PSAD as shown in FIG. 2D.

That is, in accordance with the PMOS sense amplifier overdrive signal PSAOD, an internal voltage VDL is provided in due time into the logic circuit unit 2 after the provision of external voltage VDD. In other words, the pulse width of PMOS sense amplifier overdrive signal PSAOD is determined as a fixed value by the delay rate of the delay unit 1.

As a result, when the overdriving region is determined by a predetermined delay rate and when there occurs a variation of the external voltage VDD or a bouncing of a source voltage, it becomes difficult to obtain a sufficient overdriving region.

Further, although the overdriving region is elongated in order to overcome such difficulty, there occurs an excessive current flow, thereby increasing power consumption.

SUMMARY OF THE INVENTION

The present invention is directed to solution of the conventional disadvantages. Accordingly, it is an object of the present invention to provide an overdriving control circuit capable of automatically controlling an overdriving region by sensing a variation of an external voltage or a bouncing of a source voltage, thereby preventing an otherwise unnecessary power consumption as well as securing a sufficient overdriving region.

To achieve the above described object, there is provided an overdriving control circuit according to the present invention which includes a comparator for receiving a sense amplifier enable signal and comparing a voltage of bit line or bit bar line with a reference voltage, and a sense amplifier driving unit for logically combining the sense amplifier enable signal and an output signal of the comparator and outputting a control signal of a switch which selectively supplies an internal voltage and an external voltage.

The object and advantages of the present invention will become more readily apparent from the detailed description given hereinafter. However, it should be understood that the detailed description and specific example, while indicating a preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the/present invention, wherein:

FIG. 1 is a block diagram illustrating a conventional overdriving control circuit;

FIGS. 2A through 2E are timing diagrams of respective signals in the circuit of FIG. 1;

FIG. 5 is a circuit diagram detailing a sense amplifier driving unit in the circuit of FIG. 3; and FIGS. 6A through 6D are timing diagrams of respective signals in the circuit of FIG. 3.

DETAILED DESCRIPTION OF THE PREFERRED EMBODIMENTS

With reference to the accompanying drawings, the overdriving control circuit according to the preferred embodiments of the present invention will now be described.

Figure 3:
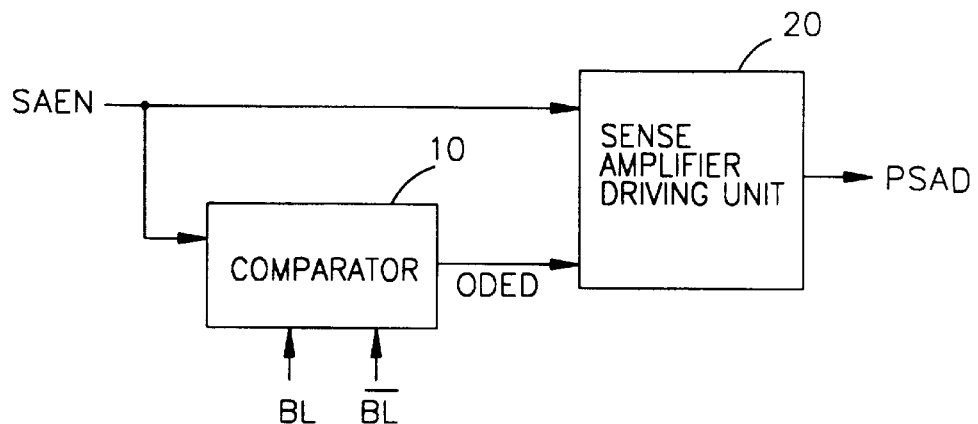
FIG. 3 is a block diagram illustrating an overdriving control circuit according to the preferred embodiments of the present invention.

As shown in FIG. 3, the overdriving control circuit according to the present invention includes a comparator 10 and a sense amplifier driving unit 20. The comparator 10 receives sense amplifier enable signal SAEN, compares the voltage of bit line BL or bit bar line /BL with reference voltage VDL-Vt (here, Vt is an threshold voltage), and outputs overdriving control signal ODED. The sense amplifier driving unit 20 including a NAND gate ND51 receives a sense amplifier enable signal SAEN and an overdriving control signal ODED, and outputs a PMOS sense amplifier drive signal PSAD.

Figure 4:
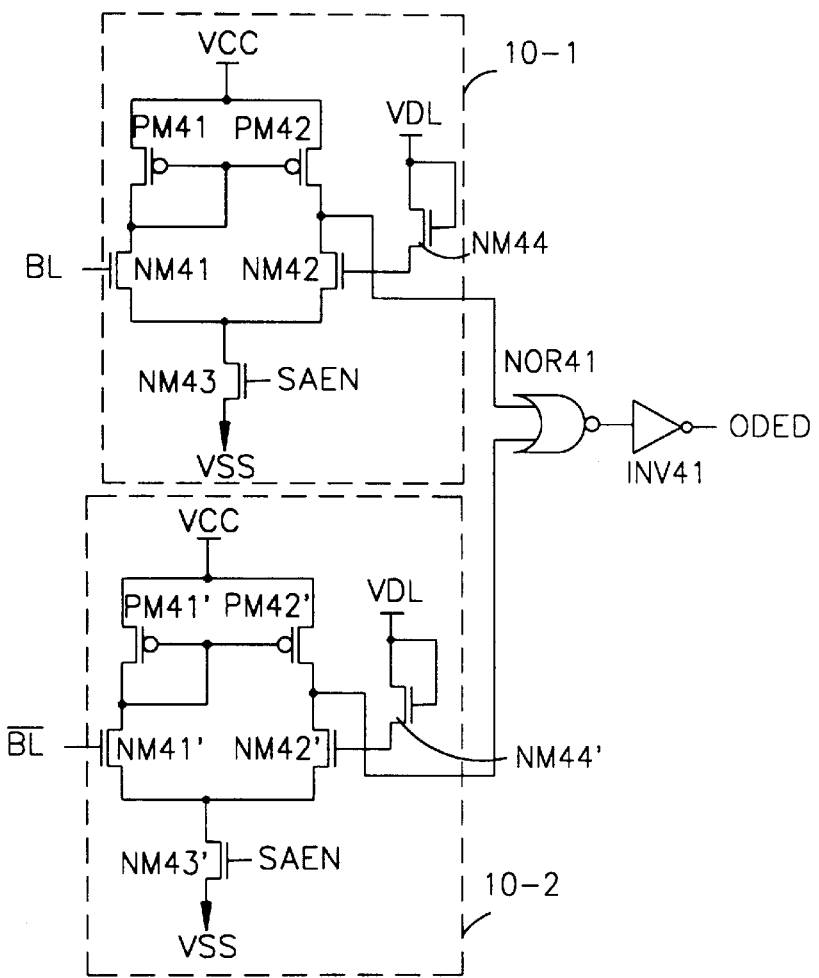
FIG. 4 is a circuit diagram detailing a comparator in the circuit of FIG. 3.

As further shown in FIG. 4, the comparator 10 includes a bit line potential comparator 10-1 for comparing the voltage of bit line BL and reference voltage VDL-Vt, a bit bar line potential comparator 10-2 for comparing the voltage of bit bar line /BL and the reference voltage VDL-Vt, a NOR gate NOR41 for NORing respective output signals of the bit line potential comparator 10-1 and the bit bar line potential comparator 10-2, and an inverter INV41 for inverting the output signal of the NOR gate NOR41 and outputting the overdriving control signal ODED.

The bit line potential comparator 10-1 includes: a pair of PMOS transistors PM41, PM42 with their sources connected to source voltage VCC; an NMOS transistor NM41 with its drain connected to both the drain of the PMOS transistor PM41 and a node between the respective gates of the PMOS transistors PM41, PM42, and with its gate connected to bit line BL; an NMOS transistor NM42 with its drain connected to that of the PMOS transistor PM42; an NMOS transistor NM43 with its drain connected in common to respective sources of the NMOS transistors NM41, NM42, with its source connected to the NMOS transistor NM43, and with its gate applied by sense amplifier enable signal SAEN; and an NMOS transistor NM44 with its source connected to the gate of the NMOS transistor NM42 and with its gate and drain connected to each other, whereby an output signal is output from a node between the PMOS transistor PM42 and the NMOS transistor NM42.

The bit bar line potential comparator 10-2 is similar to the bit line potential comparator 10-1 in composition, with the exception of bit bar line /BL being applied to the gate of the NMOS transistor NM41'.

Referring to FIG. 5, the sense amplifier driving unit 20 includes a NOR gate 51 for NORing sense amplifier enable signal SAEN and overdriving control signal ODED and outputting the PMOS sense amplifier overdrive signal PSAOD. The PMOS sense amplifier overdrive signal PSAOD is applied to the gate of a PMOS transistor PM51 which switches the connection of internal voltage VDL to a PMOS sense amplifier and the PMOS sense amplifier overdrive signal PSAOD is also applied to the gate of an NMOS transistor NM51 which switches the connection of external voltage VDD to the PMOS sense amplifier.

The operation of the overdriving control circuit will now be explained in further detail.

First, the sense amplifier enable signal SAEN as shown in FIG. 6A is applied to the comparator 10.

Then, in accordance with the bit line potential comparator 10-1, the potential of bit line BL as shown in FIG. 6D is compared to the reference voltage obtained by subtracting threshold voltage Vt from internal voltage VDL.

If the potential of the bit line BL is lower than that of the reference voltage VDL-Vt, a "low" level overdriving control signal ODED as shown in FIG. 6B is outputed from the comparator 10 to the sense amplifier driving unit 20. A "high" level PMOS sense amplifier overdrive signal PSAOD as shown in FIG. 6C is outputed from the sense amplifier driving unit 20 to turn on the NMOS transistor NM51 serving as a switch to the external voltage VDD, and turn off the PMOS transistor PM51, thereby driving the PMOS sense amplifier in accordance with the external voltage VDD.

However, when the potential of bit line BL is determined to be higher than the reference voltage VDL-Vt, the comparator 10 outputs the "high" level overdriving control signal ODED to the sense amplifier driving unit 20 which in turn outputs a "low" level PMOS sense amplifier overdrive signal PSAOD to turn on the PMOS transistor PM51, thereby interrupting the PMOS overdriving caused by the internal voltage VDL. As a result, the NMOS transistor NM51 is turned off and accordingly a normal driving begins by the internal voltage VDL.

That is, the comparator 10 compares the bit line BL and the reference voltage VDL-Vt and drives the PMOS sense amplifier using the external voltage VDD when the potential of bit line BL is lower than the reference voltage VDL-Vt, that is, during an overdriving time period T1. Also, when the potential of bit line to BL is higher than the reference voltage VDL-Vt, the PMOS sense amplifier becomes driven by the internal voltage VDL that is, during a normal driving time period T2.

As described above, the overdriving control circuit according to the present invention senses a variation of the external voltage VDD or a bouncing of source voltage and controls the overdriving region, thereby obtaining a sufficient overdriving region without a power consumption beyond a required level.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. An overdriving control circuit, comprising:
    a comparator for receiving a sense amplifier enable signal and comparing a voltage of bit line or complementary bit line with a reference voltage;
    a sense amplifier driving unit for logically combining the sense amplifier enable signal and an output signal of the comparator and outputting a control signal; and
    a switch which selectively supplies an internal voltage and an external voltage based on the control signal.

2. The overdriving control circuit of claim 1, wherein the comparator comprises:
    a bit line potential comparator for comparing a bit line voltage and the reference voltage;
    a complementary bit line potential comparator for comparing a complementary bit line voltage and the reference voltage;
    a NOR gate for NORing respective output signals of the bit line potential comparator and the complementary bit line potential comparator; and
    an inverter for inverting an output signal of the NOR gate.

3. The overdriving control circuit of claim 2, wherein the bit line potential comparator or the bit line bar potential comparator comprises:
    a first and second PMOS transistors with their sources connected to a source voltage;
    a first NMOS transistor with its drain connected to both the drain of the first PMOS transistor and a node between the respective gates of the first and second PMOS transistors, and with its gate connected to the bit line;
    a second NMOS transistor with its drain connected to a drain of the second PMOS transistor;
    a third NMOS transistor with its drain connected in common to respective sources of the first and second NMOS transistors, with its source connected to the third NMOS transistor, and with its gate applied by the sense amplifier enable signal; and
    a fourth NMOS transistor with its source connected to the gate of the second NMOS transistor and with its gate and drain connected to each other, whereby an output signal is output from a node between the second PMOS transistor and the second NMOS transistor.

4. The overdriving control circuit of claim 1, wherein the reference voltage is obtained by subtracting a threshold voltage from the internal voltage.

5. The overdriving control circuit of claim 1, wherein the sense amplifier driving unit includes a logic circuit for logically combining the output signal of the comparator and the sense amplifier enable signal.

6. The overdriving control circuit of claim 5, wherein the logic circuit includes a NOR gate.

7. The overdriving control circuit of claim 2, wherein the reference voltage is obtained by subtracting a threshold voltage from the internal voltage.

8. An overdriving circuit, comprising:

a comparator to compare a bit line voltage with a reference voltage and to compare a complementary bit line voltage with the reference voltage when enabled by a sense amplifier enable signal, and to output an output signal based on the comparisons; and a sense amplifier driving circuit to logically combine the sense amplifier enable signal and the output signal to generate a control signal.

9. The overdriving circuit of claim 8, wherein the comparator outputs a high output signal when either of the bit line voltage and the complementary bit line voltage exceeds the reference voltage.

10. The overdriving circuit of claim 8, further comprising:

a switch to selectively supply one of a normal voltage and an overdrive voltage to a sense amplifier based on the control signal.

11. A method for overdriving a sense amplifer, comprising:

receiving a sense amplifier enable signal;

comparing a bit line voltage with a reference voltage;

comparing a complementary bit line voltage with the reference voltage;

supplying an overdrive voltage to the sense amplifer until either of the bit line voltage and the complementary bit line voltage exceeds the reference voltage.

12. The method of claim 11, further comprising:

supplying an normal driving voltage to the sense amplifer after either of the bit line voltage and the complementary bit line voltage exceeds the reference voltage.

* * * * *